(12) United States Patent
Meyer

(10) Patent No.: US 9,167,242 B1
(45) Date of Patent: Oct. 20, 2015

(54) SENSOR MEASUREMENT SYSTEM AND METHOD

(76) Inventor: Leif Meyer, Berkeley, CA (US)

( * ) Notice: Subject to any disclaimer, the term of this patent is extended or adjusted under 35 U.S.C. 154(b) by 33 days.

(21) Appl. No.: 13/100,052

(22) Filed: May 3, 2011

Related U.S. Application Data

(60) Provisional application No. 61/331,211, filed on May 4, 2010.

(51) Int. Cl.
*H04N 17/00* (2006.01)

(52) U.S. Cl.
CPC .................................. *H04N 17/004* (2013.01)

(58) Field of Classification Search
CPC .................................................. H04N 2101/00
USPC .............. 348/187, 484, 180; 368/3; 715/200;
701/450; 702/130; 315/111.21;
340/447
See application file for complete search history.

(56) References Cited

U.S. PATENT DOCUMENTS

| | | | |
|---|---|---|---|
| 4,122,719 A | 10/1978 | Carlson et al. | |
| 4,413,917 A | 11/1983 | Cooper | |
| 4,436,438 A | 3/1984 | Voznick | |
| 4,956,795 A | 9/1990 | Yamaguchi et al. | |
| 5,221,893 A | 6/1993 | Kondou et al. | |
| 5,287,294 A | 2/1994 | Baert et al. | |
| 5,295,746 A | 3/1994 | Friauf et al. | |
| 5,355,129 A | 10/1994 | Baumann | |
| 5,440,237 A | 8/1995 | Brown et al. | |
| 5,491,424 A | 2/1996 | Asar et al. | |
| 5,519,644 A | 5/1996 | Benton | |
| 5,552,998 A | 9/1996 | Datta | |
| 6,230,106 B1 | 5/2001 | Metzger | |
| 6,349,270 B1 | 2/2002 | Gurary et al. | |
| 6,356,191 B1 | 3/2002 | Kirkpatrick et al. | |
| 6,556,145 B1 | 4/2003 | Kirkpatrick et al. | |
| 6,609,076 B2 | 8/2003 | Schuh et al. | |
| 6,766,248 B2 * | 7/2004 | Miyahara | 701/532 |
| 7,279,906 B2 | 10/2007 | Kay et al. | |
| 7,636,036 B2 * | 12/2009 | Manneschi | 340/454 |
| 8,429,707 B2 * | 4/2013 | Patel et al. | 725/141 |
| 2002/0115946 A1 * | 8/2002 | Cutler et al. | 601/57 |
| 2002/0154907 A1 * | 10/2002 | Ojima | 396/61 |
| 2003/0028315 A1 * | 2/2003 | Miyahara | 701/208 |
| 2004/0181799 A1 * | 9/2004 | Lu et al. | 725/18 |
| 2006/0066248 A1 * | 3/2006 | Chistyakov | 315/111.21 |
| 2007/0146715 A1 * | 6/2007 | Potyrailo et al. | 356/432 |
| 2007/0205881 A1 * | 9/2007 | Breed | 340/447 |
| 2008/0065974 A1 * | 3/2008 | Campbell | 715/200 |
| 2009/0002484 A1 * | 1/2009 | Karman et al. | 348/54 |
| 2009/0021394 A1 * | 1/2009 | Coughlin | 340/870.07 |
| 2009/0094628 A1 * | 4/2009 | Lee et al. | 725/10 |
| 2009/0108854 A1 | 4/2009 | Agevik et al. | |
| 2009/0150919 A1 * | 6/2009 | Lee et al. | 725/10 |
| 2009/0267622 A1 * | 10/2009 | Hansen et al. | 324/684 |
| 2009/0312638 A1 * | 12/2009 | Bartlett | 600/443 |
| 2010/0207754 A1 * | 8/2010 | Shostak et al. | 340/450 |
| 2010/0240945 A1 * | 9/2010 | Bikko | 600/28 |

(Continued)

*Primary Examiner* — Hunter B Lonsberry
*Assistant Examiner* — Tariq Xola Nziyo Bond
(74) *Attorney, Agent, or Firm* — Steven R. Vosen

(57) ABSTRACT

Systems and methods for using sensors with electronic devices are described. In one embodiment, a resistive-type sensor, such as a force sensor, is connected between the audio input and audio output of the electronic device. The device is programmed to provide a signal to the audio output and measure a signal at the audio input. The resistance of the sensor, and thus sensor measurement, may thus be determined.

30 Claims, 6 Drawing Sheets

(56) References Cited

U.S. PATENT DOCUMENTS

2010/0259631 A1* 10/2010 Sugita ............... 348/222.1
2010/0269127 A1* 10/2010 Krug .................... 725/18
2010/0280788 A1* 11/2010 Bohan et al. ........... 702/130
2011/0032326 A1*  2/2011 Hollander et al. ....... 348/36
2011/0234813 A1*  9/2011 Baecher et al. ......... 348/187
2011/0257464 A1* 10/2011 Kehoe .................. 600/23
2012/0002509 A1*  1/2012 Saguin et al. ........... 368/3
2012/0056847 A1*  3/2012 Milford ................ 345/174
2012/0069242 A1*  3/2012 Pearlstein ............. 348/484

* cited by examiner

SENSOR MEASUREMENT SYSTEM AND METHOD

CROSS-REFERENCE TO RELATED APPLICATIONS

This application claims the benefit of U.S. Provisional Application No. 61/331,211 filed May 4, 2010, the entire contents of which are hereby incorporated by reference herein and made part of this specification.

BACKGROUND OF THE INVENTION

1. Field of the Invention

The present invention generally relates to measurements and methods of measuring using sensors, and more particularly to a system and method for making sensor measurements using standard electronic components.

2. Discussion of the Background

The use of many types of sensors with a computer generally requires specialized circuitry between the sensor and the computer, and/or specialized circuitry within the computer. Thus, for example, resistive-type sensors may require some or all of the following: a voltage divider; a stable regulated source voltage and a signal return path that returns to ground; a dedicated discrete comparator circuit connected to the signal return side of the sensor; and/or a separate and individual signal return path and comparator. Resistive-type sensor circuits may also include additional circuit protection devices to prevent excess current flow in case of an unintended ground or short circuit The circuit features and functions described above require design, control, and manufacturing features that are complex and expensive to build. Such circuits are not incorporated within standard personal computers, smart phones, PDAs, netbooks, tablets, and similar devices (platforms) due to the mechanical and software requirements. The use of sensors with standard computing systems typically place the required components at the sensor in a package that processes the sensed parameter and transmits a digital signal on shared communication circuits for utilization by any connected processor or interface.

There is, in general, a need for a simple and inexpensive system and method of using a variety of sensors.

BRIEF SUMMARY OF THE INVENTION

The problems of using sensors are overcome by connecting the sensor to existing inputs of the electronic device or by constructing electronic devices with easily obtainable and inexpensive components, and by programming the electronic device to properly interpret a signal from the sensor. In certain embodiments, the electronic device includes audio or video processing circuits which are utilized for acquiring signals from a sensor.

In certain embodiments, a measurement system is provided, where the measurement system includes an electronic device having a processor and an input; and a sensor. The input is an audio input or a video input, and the sensor is adapted to provide a signal to the input. The processor is programmed to accept a signal from the sensor and determine a measurement from the sensor.

In certain embodiments, a measurement system is provided, where the measurement system includes an electronic device and a sensor. The electronic device includes a processor, an audio input, and an audio output. The sensor includes one or more wired connectors to provide a signal to the input and accept a signal from the output. The processor is programmed to output a signal to the sensor, accept a signal from the sensor and determine a measurement from the sensor.

In certain other embodiments, a method of using a sensor and an electronic device having an audio or video input and an audio or video output is provided. The method includes providing an electric signal output from the audio output to the sensor; receiving an electric signal input at the audio input from the sensor; and calculating a measurement by the sensor, where the calculating includes utilizing the received input signal.

The sensors may include, but are not limited to, resistive sensors, such as piezoresistive strain gauge sensor, capacitive sensors, and potentiometric sensors.

Electronic devices, also referred to herein without limitation as "platforms," may include but are not limited to, programmable electronic devices such as a computer or personal computer, smartphone, netbook, tablet, or Personal Digital Assistant (PDA), and an ever increasing number and variety of other electronic devices. Alternatively, the electronic device could be a specially constructed electronic device utilizing, for example, audio or video components as described herein.

Simplification of measurements using existing capabilities of electronic devices frees researchers and investigators, technicians and treatments from the power grid, for a fraction of the expense of prior art systems and methods.

In certain embodiments, sensors, such as resistive-type sensors, are connected electronic devices through audio or video inputs, and also, alternatively, to audio or video outputs. This provides a safe, low-power signal source and a safe low-power signal return for two-wire and three-wire resistive sensors. The sensor may thus be operated without connection to an energy source other than an output of the electronic device. Certain embodiments described herein thus eliminate custom or external electronics for using sensors, such as custom or external voltage regulators, comparators and amplifiers and signal processing controllers that are typically required for using resistive-type sensors. This is a major economic benefit to users of such sensors. In addition, the power consumption is so low that heat, shock, fire or injury is not probable, even if a short to ground or internal short circuit occurs. The electronic device can operate without connection of the sensor to an external power source. In certain other embodiments, the sensor may receive a signal from an external signal generator instead of from an audio or video output.

These features together with the various ancillary provisions and features which will become apparent to those skilled in the art from the following detailed description are attained by the measurement system and method of the present invention, preferred embodiments thereof being shown with reference to the accompanying drawings, by way of example only, wherein:

Reference symbols are used in the Figures to indicate certain components, aspects or features shown therein, with reference symbols common to more than one Figure indicating like components, aspects or features shown therein.

DETAILED DESCRIPTION OF THE INVENTION

Figure 1:
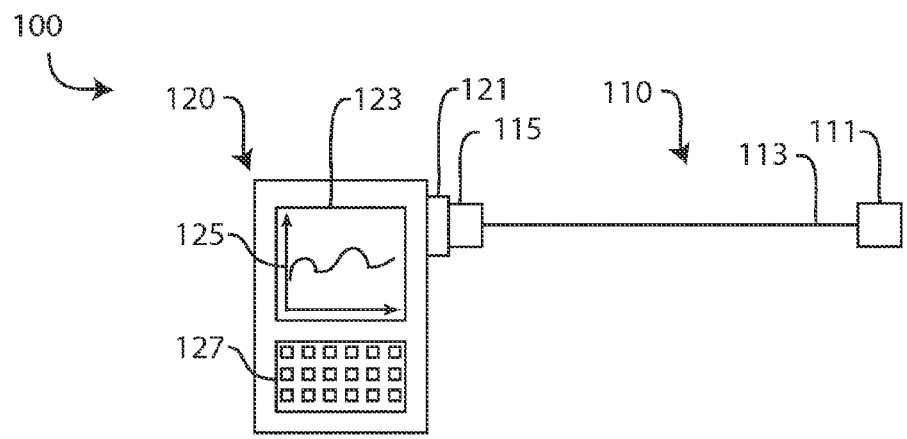
FIG. 1 is a schematic of one embodiment of a sensor measurement system including a sensing attachment connected to an electronic device.

FIG. 1 is a schematic of one embodiment of a sensor measurement system 100 including a sensing attachment 110 connected to an electronic device 120. In general, electronic device 120 includes a connector 121, and sensing attachment 110 includes one or more sensing elements, or sensors 111 having electrical leads 113 that include a connector 115 for mating to the connector 121. Electronic device 120 may, in addition, include a display 123 for presenting text or graphical information 125, an input device 127 for controlling the electronic device, memory for storing data and programming, a processor, and wired or wireless means for communicating. In certain embodiments, input device 127 may be a keyboard, touch screen, or other commonly used electronic device input mechanism.

In general, sensor 111 includes one or more elements that are responsive to a measurable property, which may be, for example and without limitation, a physical, chemical, or electrical property. Electronic device 120 includes electronic components and/or programmable components that are provided with programming code to receive signals from the one or more elements of sensor 111 such that each sensor element's output may be provided on display 123, or may be stored on a memory of the electronic device, or may be transmitted using wired or wireless communication from the electronic device. The programming code may thus, for example and without limitation, instruct electronic device 120, and in certain embodiments built-in components of the electronic device, to generate signals for sensor 111 and to measure sensor outputs using the audio output and input of electronic device 120.

In certain embodiments, signals provided to or received from sensor 111 may not be those for which connector 121 was originally intended and may be, for example and without limitation, connectors originally intended for audio or video inputs and outputs. Thus terms such as "audio output" and "audio input" are used herein without deference to the intended use of the electronic device output and input, and it is understood that they are, as used herein, actually providing and receiving signals, respectively, to sensor 111 according to programming of electronic device 120, returning a sensor measurement, and not used, for example, to power speakers or headphones or obtain an input from a microphone.

In certain other embodiments, a specially designed electronic device 120 may be specially designed for use with sensors using, for example the audio or video hardware as described herein.

Each sensor 111 may be, for example and without limitation, a resistive-type sensing element (or "resistive sensor") such as a piezoresistive pressure sensor, thermistor, or potentiometer. Thus, for example, a sensor 111 may be: a thin-film piezoresistive flexible force single-cell sensor, such as those sold under the brand name FLEXIFORCE® (Tekscan Incorporated, Boston, Mass.), which may be used for pressure, force, and weight applications; a thermistor for sensing temperature, such as the FT1005 or FT 1608, or the super small thermistor sensors using "Micro-mini" film-type thermistor chip model Fμ, (Semitec USA, Torrance, Calif.); a linear potentiometer, which may be used for position or movement sensor applications, such as Membrane Potentiometer Ultrathin Linear and ROTARY POSITION SENSORS®, including the FR4, magnet, hybrid, or Key models (Sensofoil, Peachtree City, Ga.); position sensors using the Membrane Potentiometer (SoftPot, ShieldedPot, Hotpot); oxygen sensors such as the Micro-Fuel Cell Class A-2C or B-2C or the Ultra Fast Oxygen Sensor UFO 130-2 all from Teledyne Analytical Instruments, City of Industry, Calif.; or alcohol sensors such as the MQ-3 GAS SENSOR from Hanwei Electronics Co., Ltd, Zhengzhou, Henan, China. These sensors often have excellent linearity and accuracy characteristics that are augmented by multi-point calibration performed as frequently as desired.

Alternatively, sensor 111 may be a capacitive-type sensor, in which a physical change produces a change in capacitance of the sensor, an electromagnetic-type sensor, in which a physical change produces a change in inductance of a sensor, or a piezo vibration sensor (Measurement Specialties, Inc., Hampton, Va.).

Electronic device 120 includes circuitry for receiving electronic signals that, through programming and connectors 115 and 121, are adapted to utilize sensor 111. Alternatively, electronic device 120 includes circuitry to provide signals for operating or providing an excitation signal for operation of sensor 111. Examples of the circuitry that may be used with the present invention include, but are not limited to, mono or stereo audio processing electronics that are widely available and provided on electronic devices such as personal computers, PDAs, smartphones, tablets, and the like. In one alternative embodiment, sensing attachment 110 may include electronics for communicating wirelessly with electronic device 120.

In various embodiments, a microphone port or USB I/O (Sound Card Adapter) converter of electronic device 120 may be configured to obtain data from one sensor 111 using a mono input/output, from two sensors using one or more outputs and two inputs of a stereo sound system, or from more than one sensor using multi-channel encoded signal monitoring. It has been found by the inventor that electronic device 120, such as a personal computer, having stereo audio signal microphone inputs, may be programmed, for example, to obtain and display pressures as measured by a resistive sensor 111 in real time.

Figure 2:
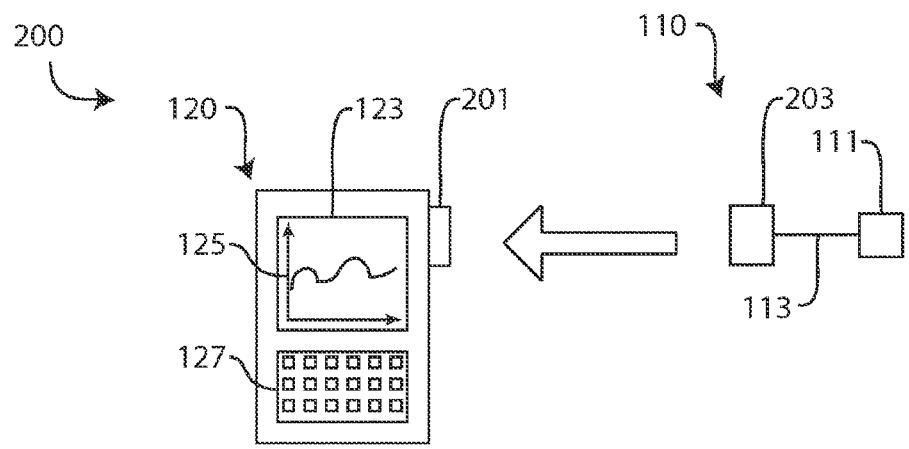
FIG. 2 is a schematic of a wireless sensor measurement system.

FIG. 2 is a schematic of another embodiment of a wireless sensor measurement system 200, which may be generally similar to system 100, except as further detailed below. Where possible, similar elements are identified with identical reference numerals in the depiction of sensor measurement systems 100 and 200.

Sensor measurement system 200 is a wireless system, in which electronic device 120 includes a wireless transmitter/ receiver 201 and sensing attachment 110 includes wireless transmitter/receiver 203. Thus, for example, wireless transmitter/receiver 203 may include a signal generator to provide a signal to sensor 111, and an A/D converter to digitize a signal from sensor 111 and transmit the signal back to electronic device 120. The transmitter/receiver pair 201/203 may be, for example and without limitation, a BLUETOOTH™ communication system such as the Xterasys Bluetooth Audio Receiver model BSR202 with microphone, or a wireless audio adapter such as the Audioengine model AW1 Premium Wireless Audio Adapter from Audioengine, Kowloon, Hong Kong.

The following discussion, which is illustrative and not intended to limit the scope of the present invention, describes a resistive-type sensor connected, by wires and connectors, to standard audio inputs and outputs of an electronic device. It will be appreciated that the invention may also include sensors that are hard-wired into such inputs and outputs, or that are wireless.

Figure 3:
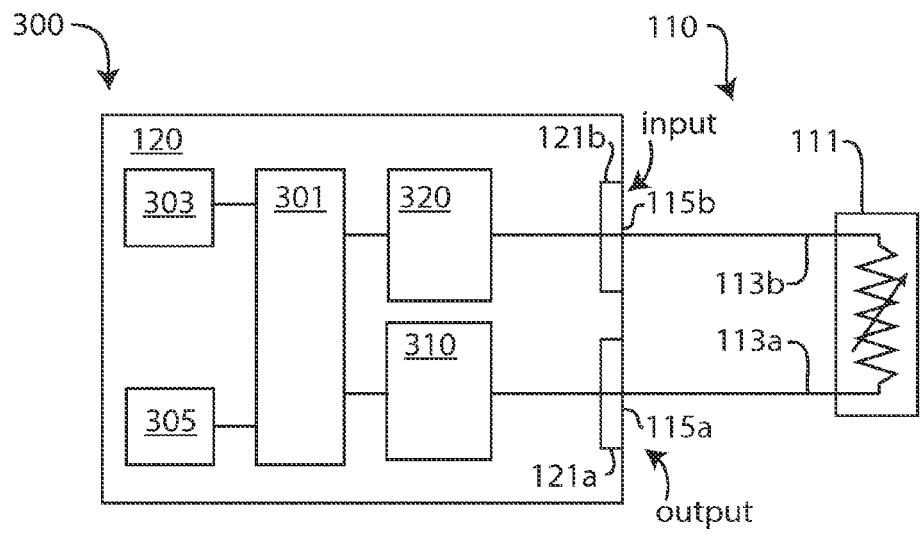
FIG. 3 is a schematic of an embodiment of a sensor measurement system having a resistive-type sensor.

FIG. 3 is a schematic of an embodiment of sensor measurement system 300 having a resistive-type sensor, which may be generally similar to sensor measurement systems 100 or 200, except as further detailed below. Where possible, similar elements are identified with identical reference numerals in the depiction of sensor measurement systems 100, 200, and 300.

In certain embodiments, electronic device 120 includes digital-analog and analog-digital converters (such as a sound or video chips or cards) to interface between analog voltages outside of the electronic device and digital information within the electronic device through connectors 115. It should be appreciated that, in certain embodiments, connector 121 may include standard connector(s) that are adapted, by programming of electronic device 120, to interact with sensors 111 in ways not originally intended for the connector.

Sensing attachment 110 of FIG. 3 has a resistive-type sensing element 111 and a pair of electrical leads 113a and 113b terminating in connectors 115a and 115b, respectively. Electronic device 120 includes an output circuit 310 accessible by a connector 121a, an input circuit 320 accessible by a connector 121b, a processor 301, memory 303, and means of communication 305. Memory 303 is provided with programming for processor 301 to provide waveforms to audio output circuit 310, to receive signals from audio input circuit 320, and, alternatively, to store information related to the operation of element 111. The memory or programming of processor 301 may thus send or receive data or programming over communication means 305, which may be a wired, wireless, or a removable physical device, such as a disk or flash memory. In addition, processor 301 may also provide display information to display 123 for the operation of sensor 111 including, in certain embodiments, calibration of a sensor, and for the display of sensor output, and receive input from input device 127.

When connectors 115a and 115b are joined to connectors 121a and 121b, respectively, the "output" provides signals, such as excitation voltage or current, to sensor 111 from output circuit 310, and a return signal may be accepted to input circuit 320.

In various embodiments, circuits 310 and 320 are video processing or audio processing circuits, and connectors 121a and 121b are corresponding video or audio connector or connectors.

Figure 4:
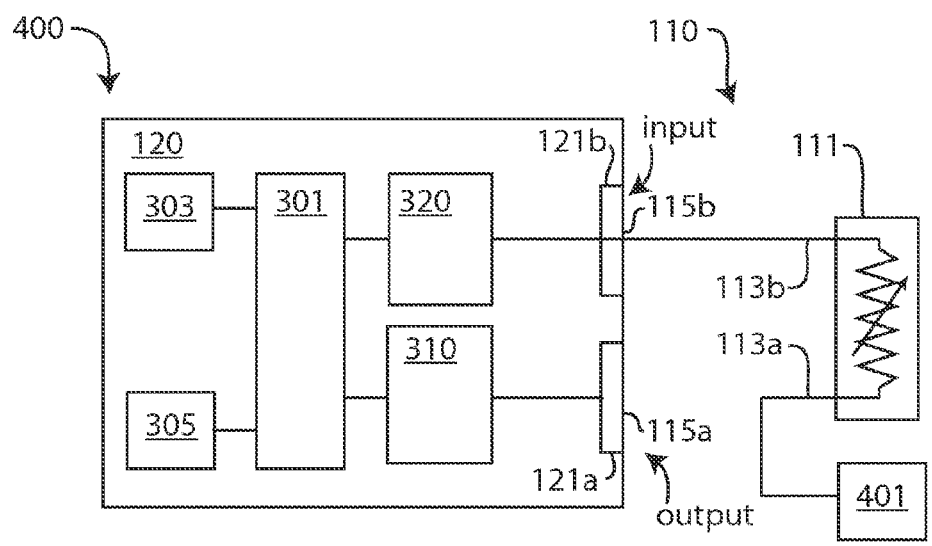
FIG. 4 is a schematic of an embodiment of a sensor measurement system using an external signal generator.

FIG. 4 is a schematic of another embodiment of sensor measurement system 400, which may be generally similar to sensor measurement systems 100, 200, or 300 except as further detailed below. Where possible, similar elements are identified with identical reference numerals in the depiction of sensor measurement systems 100, 200, 300, and 400.

Sensor measurement system 400 includes a signal generator 401. Signal generator 401 is connected to lead 113a to provide an excitation signal to sensor 111. Sensor measurement system 400 thus only requires one connection to sensor 111.

Figure 5:
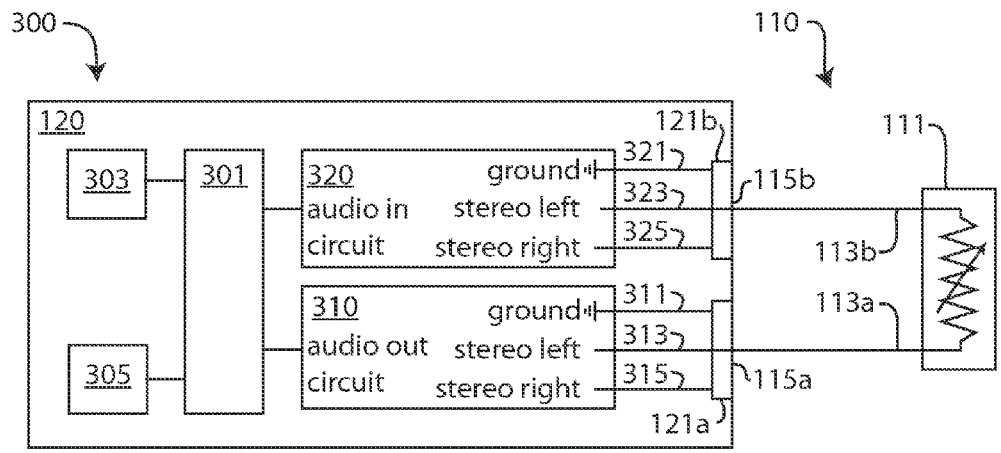
FIG. 5 is a schematic of an embodiment of a sensor measurement system having one resistive-type sensor connected to an audio output and audio input.

FIG. 5 is a specific embodiment of sensor measurement system 300 using audio inputs and outputs, which may be generally similar to sensor measurement systems 100 or 300, as described above, except as further detailed below. Where possible, similar elements are identified with identical reference numerals in the depiction of sensor measurement systems 100 and 300.

In sensor measurement system 300 of FIG. 5, output circuit 310 is an audio output circuit that includes a ground 311, a stereo left output 313, and a stereo right output 315 that are each potentially accessible through connector 121a. Input circuit 320 is an audio input circuit that includes a ground 321, a stereo left input 323, and a stereo right input 315 that are each potentially accessible through connector 121b. Audio output circuit 310 and audio input circuit 320 are the built-in audio components of electronic device 120. Examples of circuits 310 and 320 include sound cards manufactured for PCs by Creative Technology Ltd. of Singapore, or the onboard audio circuits of a PC or MACINTOSH™ computer, or a smartphone.

As shown in FIG. 5, connector 115a connects sensor 111 to stereo left output 313 and connector 115b connects sensor 111 to stereo left input 323, and grounds 311 and 321, output 315, and input 325 are not used. With connector 115a attached to connector 121a and connector 115b attached to connector 121b, an electrical connection is established between the audio left output 313, sensor 111, and the audio left input 323. As described subsequently, electronic device 120 may be programmed to provide a signal to audio output 313 and measure the resulting signal at input 323 to provide a measure of a change at sensor 111, such as a pressure as measured by a resistive-type pressure sensor.

Connectors 115/121 may be any type of electrical connector, such as a phono jack or USB connector. Specifically, and by way of illustrative examples, connectors 115/121 may include matching pairs of: one or two TSR (tip, ring, sleeve) connectors, such as a mono or stereo audio jack, phone jack, phone plug, jack plug, stereo plug, mini-jack, mini-stereo, or headphone jack; a USB connector; or one or more specialized connectors for connection to an electronic device, such as a smartphone.

Alternatively connectors 115/121 may include adapters to provide a connection between connectors at the end of electrical leads 113 and electronic device 120, and may include, for example mini jack to USB connector, a StarTech USB 2.0 to Audio Adapter, or USB 2.0 to Mic/Speaker 5.1 Audio Sound Card Adapter Model HY554, or USB 2.0 3D 7.1 Channel Audio Sound Card Adapter, or the USB 2.0 3D Audio Sound Card Adapter 7.1 Ch Mic/Speaker (mono input).

In alternative embodiments, audio output circuit 310 and input circuit 320 may be single channel (monaural), and/or may be combined within a single connector. In another alternative embodiment, each channel (right and left) may be connected to a separate sensor, allowing for the measurement of two sensors.

Figure 6:
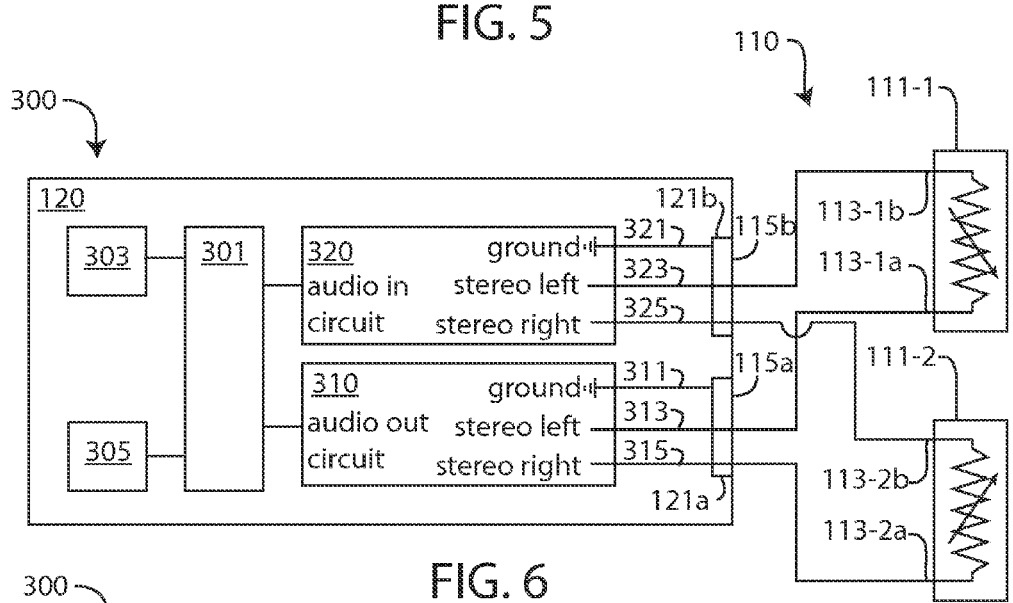
FIG. 6 is a schematic of an embodiment of a sensor measurement system having two resistive-type sensors connected to separate channels of an audio output and audio input.

FIG. 6 is a specific embodiment of sensor measurement system 300 using audio inputs and outputs, which may be generally similar to sensor measurement systems 100 or 300, as described above, except as further detailed below. Where possible, similar elements are identified with identical reference numerals in the depiction of sensor measurement systems 100 and 300.

Sensing attachment 110 of FIG. 6 includes two sensors: one sensor connected to the "left" audio channels and a second sensor connected to the "right" audio channel. Specifically, the sensing attachment 110 includes a first resistive-type sensing element 111-1 and a second resistive-type sensing element 111-2. Sensing elements 111-1 and 111-2 each have a pair of electrical leads 113-1a, 113-1b and 113-2a, 113-2b terminating in connectors 115a and 115b, respectively. Connectors 115a and 115b provide leads 113-la and 113-1b of sensing element 111-1 to "left" audio channel output 313 and input 323, as for sensing element 111 of FIG. 5, and provide leads 113-2a and 113-2b to "right" audio channel output 315 and input 325.

Figure 7:
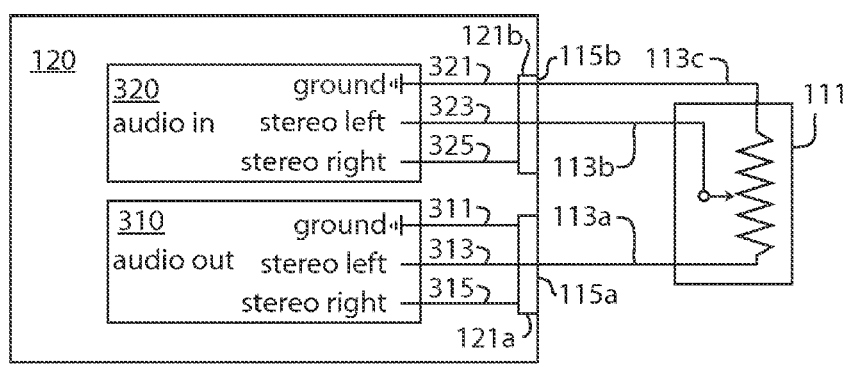
FIG. 7 is a schematic of an embodiment of a sensor measurement system having one sensing element and three electrical leads.

FIG. 7 is a specific embodiment of sensor measurement system 300 using audio inputs and outputs, which may be generally similar to sensor measurement systems 100 or 300, as described above, except as further detailed below. Where possible, similar elements are identified with identical reference numerals in the depiction of sensor measurement systems 100 and 300.

Sensing attachment 110 of FIG. 7 includes one potentiometric-type sensing element 111 and three electrical leads 113a, 113b, and 113c terminating in connectors 115a and 115b, respectively. As shown in FIG. 4, ground 311, output 315, and input 325 are not used, and with connector 115a attached to connector 121a and connector 115b attached to connector 121b, an electrical connection is established between the audio left output 313, through lead 113a, to one side of sensor 111, the audio left input 323, through lead 113b, to a center lead of the sensor, and ground 321, through lead 113c, to another lead of the sensor. As described subsequently, electronic device 120 may be programmed to provide a signal to audio output 313 and measure the resulting signal at input 323 to provide a measure of a change at sensor 111.

Methods of Use

Several methods of use of sensing attachments 110 by electronic devices 120 will now be described. In certain embodiments, the use includes providing and using programming provided to the electronic device. The programming may include, for example and without limitation, the generating of signals to an output of the electronic device (using, for example, an "audio output") and the receiving of signals into the electronic device (into, for example, an "audio input"). Such programming is well known in the field. What is not well-known, and is novel here, is the connection of a sensor to, for example, the audio input and audio output of an electronic device and interpreting the input to provide a sensor output. The following discussion highlights, without limitation to the scope of the present invention, the operation of such programming in the embodiment of FIG. 5 to obtain such sensor output and, alternatively, to calibrate the sensor output.

Figures 8, 9:
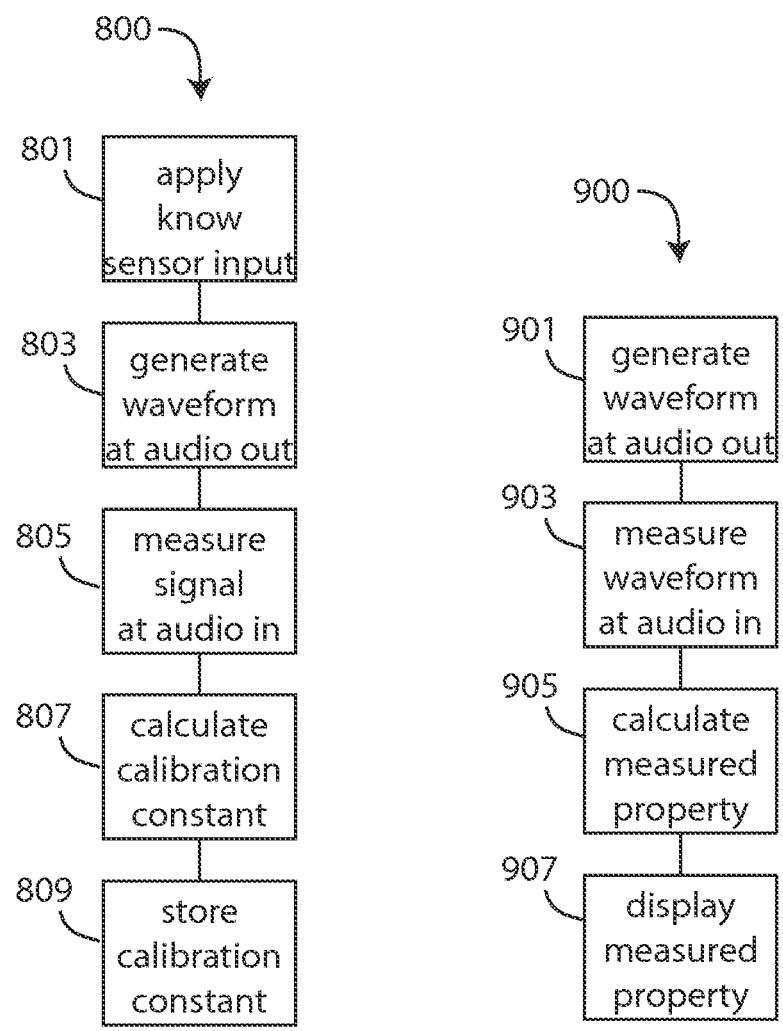
FIG. 8 is a block diagram for a method of calibrating a sensor.
FIG. 9 is a block diagram for a method of using a sensor.

In one embodiment, a program is provided to memory 303 that may be used to calibrate a sensor 111, as shown in FIG. 8 as block diagram 800 for a method of calibrating a sensor.

Prior to calibrating, a user attaches a sensing attachment 110 to electronic device 120 and provides programming to the device. Sensor 111 is thus ready to receive signals from audio output circuit 310 and provide attenuated signals to audio input circuit 320.

In block 801, the programming instructs the user, such as by a text display 123, to apply a known input to the sensor. Thus, for example, for a pressure sensor, the user is instructed to provide sensor 111 with a known pressure, or a known weight over a specified area. For a temperature sensor, the user is instructed to provide sensor 111 with a known temperature. The "known" value may either be provided by the programming, or may be input to the programming by the user by input device 127. In either case, the sensor is provided with an input having a physical or other measureable value (such as temperature or pressure) that is known or provided to electronic device 120.

Next, in block 803, the electronic device 120 generates a waveform at the audio output. The waveform may, for example, be generated from a pre-generated digital audio file having a frequency of from 10 Hz to 4,000 MHz or more, where the frequency is limited only by the capacity of the sound card or USB I/O converter adapter, or the waveform may be generated by synthesized signal generator software provided by audio output circuit 310 or other programming in memory 303.

The shape of the waveform provided by output 313 may include, but is not limited to, a saw-tooth, square, sine, modified sine, triangle, step, rectangular, or any other pulse train, audio tone (whether with hearing range or not), warble wave format including complex waves, arbitrary waves, and intermittent streams. Alternative embodiments include a sound card, logic signal source generators including a pulse pattern generator (PPG) or a data timing generator (DTG) or digital modulation within electronic device 120.

It has been found that some waveform shapes may have better accuracy and repeatability and have minimal sampling or processing difficulty, depending on the sensor. These issues may be overcome by adjusting the sampling and processing of the returned signal rather than focusing on limitations of the output signal. Phase shift (delay) is not a consideration, neither as to excessive or insufficient expected phase shift. The software may be configured to perform a checking/comparator function incorporating a phase shift correction factor for circuit validation or fault monitoring. This could be done, for example and without limitation, by transmitting an identical signal to the one provided to the sensor directly between another audio output and input, with no sensor in between, and using the data from the input of this signal for comparison.

In one embodiment, the audio output circuit 310 provides a periodic, 16 kHz signal from a MACINTOSH™ computer internal sound card, and a 9 kHz output command for an external USB audio I/O converter. In one embodiment, the output waveform is a sine wave. Tailoring the processing using hardware and software to obtain the best data and display for stability, smoothness, and accuracy is performed using the following controlled features by design: partial wave inversion, variable and calibrated sample rate ranging from 0 Hz to 1 MHz; including signal buffering, smoothing, chopping, averaging, trending, bracketing, interpolating, transforming and extrapolating.

It has been found that if the audio output frequency is less than 1-10 Hz, then signal to noise issues may require additional processing, such as the use of an Electronically/Exponentially Weighted Moving Average (EWMA) signal monitoring and control modifier. EWMA may be used at any frequency for improved smoothing performance. Additional smoothing is performed by high and low-pass frequency filter algorithm and by elimination of outliers and anti-aliasing.

In block 805, electronic device 120 receives a signal at the audio input circuit 320. In one embodiment, the "audio input" signal is sampled at 44.1 kHz. The absolute value of each sample is taken to represent its amplitude, and groups of 512 sample amplitudes are averaged to yield one datum representing the sensor's conductance. The data may be smoothed using a low-pass frequency filter prior to display/plot.

It has been found that some resistive sensors/controls (such as potentiometers) may have sufficient electrical capacitance to alter the signal waveform—that is, the sensor output is not linear and the audio input and audio output have different shapes. This capacitance may be a benefit to the signal processing as it provides a smoothing of the waveform peaks such that signal processing software parameters or additional external smoothing does not normally need to be considered or implemented. However relatively higher capacitance sensors would require reduction of the output wave frequency.

The sensors used in parameter measurement have no practical limit as to resistance or conductance. Valid sampling can occur from the highest (maximum) resistance range to the lowest (minimum) resistance range of the sensor, i.e. signal validity ranges from 0 ohms to 100 megaohms. Valid sampling can occur from the highest (maximum) conductance range to the lowest (minimum) conductance range of the sensor, i.e. signal validity ranges from 0 siemens to the capacity of the circuit and devices. Current limitations or voltage limitations are those of the electronic device's sound card or USB audio I/O converter device 320 and 310.

In certain embodiments, the signal output levels may be less than 5 volts, with a current in the milliamp range, i.e. the normal audio output levels needed to power an earphone or small unamplified computer speaker. For higher audio signal output strengths, additional circuit resistance may become appropriate.

In block 807 the electronic device calculates a calibration constant. In certain embodiments, a point-by-point value or average over a time window (such as an integral number of output waveforms) of the output voltage V313, measured input voltage V323, and known sensor input may be used. For a linear pressure sensor response, for example:

$$C=P*V313/V323,$$

where P is a known force (in Pa), V323 is a voltage measured at input 323 and V313 is the voltage provided at output 313, and C is a calibration constant (Pa per voltage in/voltage out).

In another embodiment, blocks 801, 803, and 805 are repeated for 2 or more points to allow block 807 to obtain a calibration over a range, using, for example, a linear or non-linear regression. Alternatively, a sensor model having parameters for sensor response time may be used, and the calibration may include providing step functions to sensor 111.

In block 809 the calibration constant C, regression coefficients, or sensor model parameters are stored in memory 303 for later use in determining sensor measurements.

In another embodiment, a program is provided to memory 303 that may be used to measure a physical property using sensor 111, as shown in the FIG. 9 as a block diagram 900 of such a method of using a sensor.

Prior to using the sensor, a user attaches a sensing attachment 110 to electronic device 120 and provides programming to the device. Sensor 111 is thus ready to receive signals from audio output circuit 310 and provide attenuated signals to audio input circuit 320.

In block 901, a waveform is generated at audio output circuit 310. Block 901 is similar to block 803 of FIG. 8, as well as the considerations of frequency and waveform. In certain embodiments, the waveform of block 901 is identical to that used to calibrate the sensor in block 803.

In block 903, electronic device 120 receives a signal at the audio input circuit 320. Block 903 is similar to block 805 of FIG. 8, as well as the considerations of frequency and waveform. In certain embodiments, the sampling of block 903 is identical to that of block 805. In certain other embodiments, electronic device 120 continuously receives signals from audio input 320 at 44.1 kHz, and in groups of 512 samples, and the absolute values of all 512 data are averaged and paired with the computer's clock time to yield one preprocessed point of the form (time, signal amplitude). These points are stored in a buffer.

In block 905 electronic device 120 uses linear interpolation or extrapolation, or a more complex response function (including, for example, response time) to convert signal input to a measured value (such as pressure, force, or temperature).

In block 907, electronic device 120 provides the measured values to display 120. Thus, for example, a continuous graph 125 of measured value versus time may be provided. Current signal, time, and measured value may be displayed numerically and updated several time per second. In certain embodiments, the display is updated five times per second. In certain embodiments, the graph 125 may be adjustable. Also, graph 125 may be frozen by the user, and the user can trace the graph with the mouse or arrow keys to see a numerical time, signal, and value display of any graphed datum.

Other Alternative Embodiments

Figure 10:
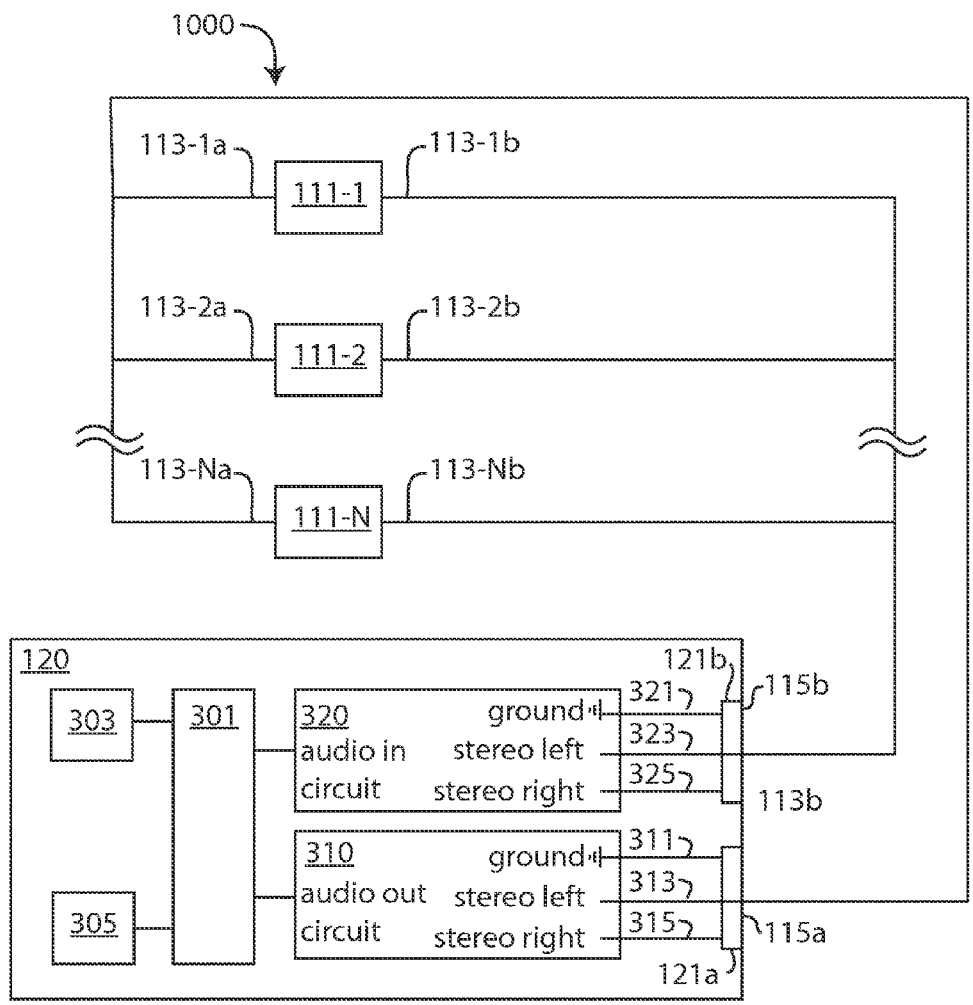
FIG. 10 is a schematic of another embodiment of a sensor measurement system providing and receiving signals over single leads.

In addition to the use of individual sensors with audio or video signal processing channels, it is also possible to use additional sensors per channel. As an example, FIG. 10 is a schematic of another embodiment of a sensor measurement system 1000 providing and receiving signals over single leads. Sensor measurement system 1000 may be generally similar to sensor measurement systems 100, 300 or 400 except as further detailed below. Where possible, similar elements are identified with identical reference numerals in the depiction of sensor measurement systems 100, 300, 400, and 1000.

In sensor measurement system 1000, plurality of sensors 111-1, 111-2, . . . , 111-N are connected in parallel to stereo left output 313 through lines 113-1a, 113-2a, . . . , 113-Na, respectively, and in parallel to stereo left input 323 through lines 113-1b, 113-2b, . . . , 113-Nb, respectively.

The programming of electronic device 120 of sensor measurement system 1000 includes a waveform of different frequencies at stereo left output 313. Each sensor 111-1, 111-2, . . . , 111-N includes electronics to allow only certain frequencies to pass through the sensor. The programming of electronic device 120 of sensor measurement system 1000 further includes digital filters to differentiate the signals obtained from each sensor 111-1, 111-2, . . . , 111-N.

Figure 11:
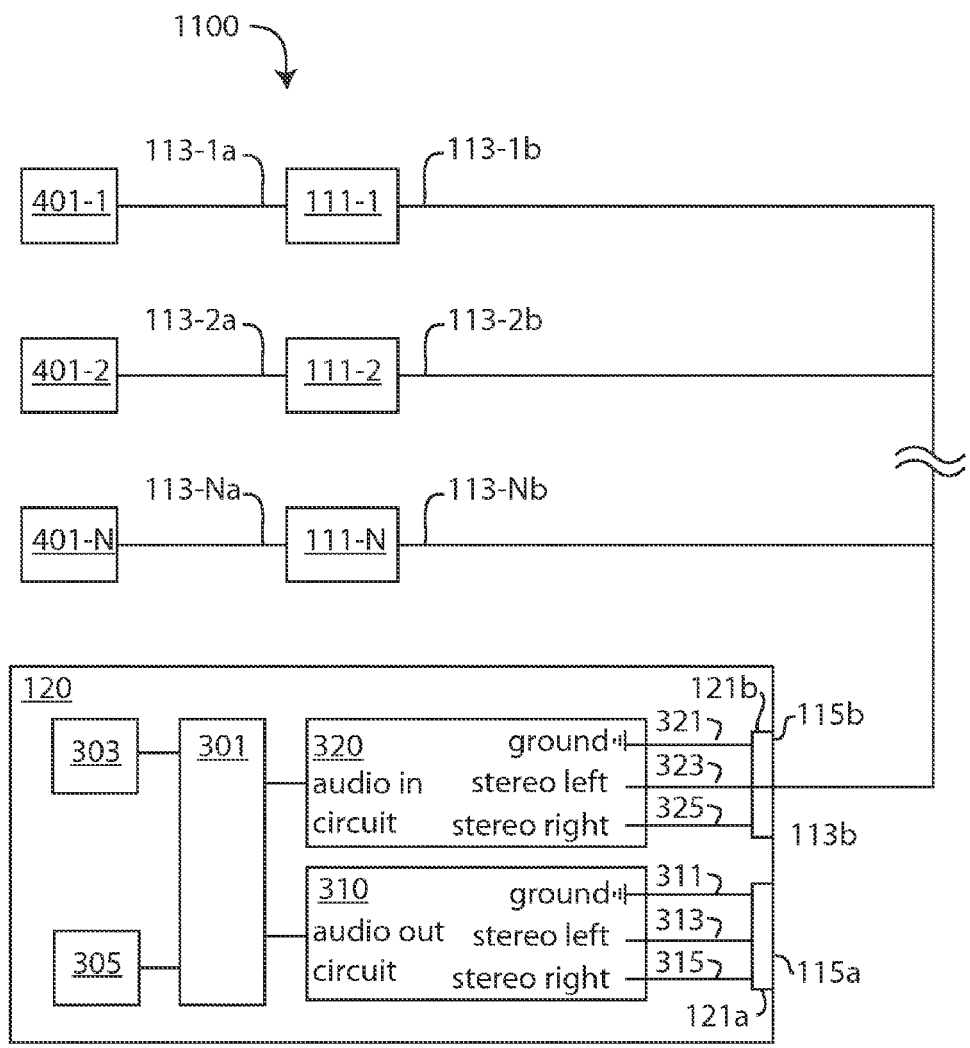
FIG. 11 is a schematic of another embodiment of a sensor measurement system using external signal generators.

FIG. 11 is a schematic of another embodiment of a sensor measurement system 1100 using external signal generators. Sensor measurement system 1100 may be generally similar to sensor measurement systems 100, 300, 400 or 1000, except as further detailed below. Where possible, similar elements are identified with identical reference numerals in the depiction of sensor measurement systems 100, 300, 400, 1000, and 1100.

In sensor measurement system 1100, each of a plurality of external signal generators 401-1, 401-2, . . . 401-N are connected through lines 113-1a, 113-2a, . . . , 113-Na to one of a plurality of sensors 111-1, 111-2, . . . , 111-N. Sensors 111 are each connected to stereo left input 323 through lines 113-1b, 113-2b, . . . , 113-Nb, respectively. The programming of electronic device 120 of sensor measurement system 1100 includes digital filters to differentiate the signals obtained from each sensor 111-1, 111-2, . . . , 111-N according to the known frequency of provided to each sensor.

Possible Uses of the Present Invention

Possible uses for the sensor measuring systems described herein include, but are not limited to:

- Medicine and body care and treatment including drug delivery monitoring, dentistry, studies of surgery techniques and tools, diagnostic devices, diagnostic palpation, massage, compression garments and bandaging, physical therapy, skin conductance, blood sugar or oxygen levels, and toxin levels;
- Automotive controls and testing including brake, clutch, accelerator pressures, impact and vibration, handle, latch controls, moveable component forces and weights; Seatbelt or restraints research and measurements, occupant detection, Supplemental Restraint System monitoring and research; oxygen, alcohol and other sensor monitoring;
- Aviation pressures and loading points, load distribution, door and latch position;
- Recreation/Sports signals and inputs for video game controllers/virtual reality games and teaching, sporting equipment force, temperature, position, acceleration, contact, weight measurement, and training for sports;
- Environmental/habitation monitoring for humans, livestock, pets, including temperature, humidity, oxygen levels, movement, etc.
- Industry uses for intruder detection and security devices, packaging and shipping monitoring, sealing and automated operations measurements, equipment performance and monitoring, robotics, inventory counting and weighing, food processing;
- Miscellaneous uses include grip, weight, pressure, force, button or knob controls, temperature, and motion acting upon human activities and animal behavior, and botanical or cooking temperature monitoring, humidity, water content, breath alcohol levels, etc.
- Research and Gaming involving any of the above applications.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner, as would be apparent to one of ordinary skill in the art from this disclosure, in one or more embodiments.

Similarly, it should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Thus, while there has been described what is believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

I claim:

1. A measurement system for operating sensors, said system comprising:
    an electronic device having a processor, an input, and an output, where said electronic device is a personal computer, a tablet personal computer, or a smartphone, where said input is an audio input, where said output is an audio output,
    and where said output provides a signal including a periodic waveform generated by said electronic device; and a sensor to measure a property, where said sensor is a resistive-type sensor, where said sensor is a pressure sensor, a force sensor, or a temperature sensor, where said sensor is connectable to said input of said electronic device and said output of said electronic device, and where said sensor, when connected to both said input of said electronic device and said output of said electronic device accepts said periodic waveform from said output of said electronic device,
    modifies said periodic waveform in response to the property, and
    provides the modified periodic waveform to said input of said electronic device, and where said processor is programmed to accept the modified signal and determine a measurement of the property using said periodic waveform modified by said sensor in response to the property.

2. The measurement system of claim 1, further comprising: a signal generator having an output;
    where said sensor, when connected to both said input of said electronic device and said output of said electronic device, accepts a signal from said output of said signal generator.

3. The measurement system of claim 1, where said sensor, when connected to both said input of said electronic device and said output of said electronic device, accepts the signal from said electronic device and provides the modified signal to said electronic device using a wired connection.

4. The measurement system of claim 1, where said sensor, when connected to both said input of said electronic device and said output of said electronic device, accepts the signal from said electronic device and provides the modified signal to said electronic device using a wireless connection.

5. The measurement system of claim 1, where said sensor is a plurality of sensors, and where said input of said electronic device is a plurality of inputs, and where, when said sensor is connected to both said input of said electronic device and said output of said electronic device, each input of said plurality of inputs accepts a signal from one of said plurality of sensors.

6. The measurement system of claim 1, where said sensor is a plurality of sensors, and where said input of said electronic device is a plurality of inputs, and where, when said sensor is connected to both said input of said electronic device and said output of said electronic device, at least one input of said plurality of inputs is adapted to accept the periodic waveform generated by said electronic device from two or more of said plurality of sensors.

7. The measurement system of claim 1, where said sensor is a plurality of sensors, and where said output of said electronic device is a plurality of outputs, and where, when said sensor is connected to both said input of said electronic device and said output of said electronic device, each output of said plurality of outputs provides the periodic waveform generated by said electronic device to one of said plurality of sensors.

8. The measurement system of claim 1, where said sensor is a plurality of sensors, and where said output of said electronic device is a plurality of outputs, and where, when said sensor is connected to both said input of said electronic device and said output of said electronic device, at least one output of said plurality of outputs provides the periodic waveform generated by said electronic device to two or more of said plurality of sensors.

9. The measurement system of claim 1, where said system includes two or more resistive sensors each connected to both the input of said electronic device.

10. The measurement system of claim 3, where said sensor, when connected to both said input of said electronic device and said output of said electronic device provides a signal to said input of said electronic device through a TSR or USB connector.

11. The measurement system of claim 1, where said electronic device includes a display, and where said display provides a repeatedly updated indicator of the measurement of the property.

12. The measurement system of claim 1, where said electronic device includes a display, and where said processor is programmed to provide an indicator of the determined measurement on said display.

13. A measurement system for operating sensors, said system comprising:
an electronic device having a processor, an input, and an output, where said input is an audio input or a video input, where said output is an audio output or a video output, and where said output provides a signal generated by said electronic device;
where said electronic device is a personal computer, a tablet personal computer, or a smartphone,
and a sensor to measure a property, where said sensor includes a wired connector connected to both said input of said electronic device and said output of said electronic device, and where, when said wired connector is connected to both said input of said electronic device and said output of said electronic device, said sensor accepts a signal from said output of said electronic device,
modifies said signal in response to the property,
and provides the modified signal to said input of said electronic device,
and where said processor is programmed to accept the modified signal and determine a measurement of the property using said signal modified by said sensor in response to the property.

14. The measurement system of claim 13, where said sensor is a plurality of sensors, and where said input of said electronic device is a plurality of inputs, and where, when said sensor is connected to both said input of said electronic device and said output of said electronic device, each input of said plurality of inputs accepts a signal from one of said plurality of resistive-type sensors.

15. The measurement system of claim 13, where said sensor is a plurality of sensors, and where said input of said electronic device is a plurality of inputs, and where, when said sensor is connected to both said input of said electronic device and said output of said electronic device, at least one input of said plurality of inputs accepts a signal from two or more of said plurality of resistive-type sensors.

16. The measurement system of claim 13, where said sensor is a plurality of sensors, and where said output of said electronic device is a plurality of outputs, and where, when said sensor is connected to both said input of said electronic device and said output of said electronic device, each output of said plurality of outputs provides a signal to one of said plurality of resistive-type sensors.

17. The measurement system of claim 13, where said sensor is a plurality of sensors, and where said output of said electronic device is a plurality of outputs, and where, when said sensor is connected to both said input of said electronic device and said output of said electronic device, at least one output of said plurality of outputs provides a signal to two or more of said plurality of resistive-type sensors.

18. The measurement system of claim 13, where said connector is a TSR or USB connector.

19. The measurement system of claim 13, where said electronic device includes a display, and where said display provides a repeatedly updated indicator of the measurement of the property.

20. The measurement system of claim 13, where said electronic device includes a display, and where said processor is programmed to provide an indicator of the determined measurement on said display.

21. The measurement system of claim 13, where said sensor is a resistive-type sensor.

22. The measurement system of claim 13, where said sensor is a pressure, force, or temperature sensor.

23. The measurement system of claim 13, where said signal is a periodic waveform.

24. The measurement system of claim 13, where said input is an audio input and said output is an audio output.

25. A method of using a sensor responsive to a property, where said sensor is a resistive-type sensor, and where said property is a pressure, a force, or a temperature, and an electronic device having a processor, an audio input and an audio output, where said electronic device is a personal computer, a tablet personal computer, or a smartphone, said method comprising:
providing a periodic electric signal waveform from the audio output to the sensor;
receiving an electric signal waveform from the sensor at the audio input, where the received electric signal waveform is the provided periodic electric signal waveform modified by the sensor according to the property;
and calculating, in the processor, a measurement of the property using the modified periodic electric signal waveform, such that the processor determines the property from the periodic electric signal waveform modified by the sensor.

26. The method of claim 25, where said periodic electric signal waveform has a frequency of from 10 Hz to 4,000 MHz.

27. The method of claim 25, where said receiving includes continuously sampling the periodic electric signal waveform modified by the sensor according to the property.

28. The method of claim 27, where said receiving includes sampling the periodic electric waveform signal modified by the sensor according to the property at a constant rate.

29. The method of claim 25, where said electronic device includes a display, where said method further comprises providing an indicator of the determined measurement on said display.

30. The method of claim 25, where the provided periodic electric signal waveform is modified by the sensor by a reduction of the amplitude of the periodic electric signal waveform.

* * * * *